US011501553B2

(12) United States Patent
Lignier

(10) Patent No.: US 11,501,553 B2
(45) Date of Patent: Nov. 15, 2022

(54) COST-EFFICIENT FINGERPRINT SENSOR COMPONENT AND MANUFACTURING METHOD

(71) Applicant: Fingerprint Cards AB, Gothenburg (SE)

(72) Inventor: Olivier Lignier, Préverenges (CH)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 219 days.

(21) Appl. No.: 16/763,671

(22) PCT Filed: Nov. 15, 2018

(86) PCT No.: PCT/SE2018/051177
§ 371 (c)(1),
(2) Date: May 13, 2020

(87) PCT Pub. No.: WO2019/103681
PCT Pub. Date: May 31, 2019

(65) Prior Publication Data
US 2021/0407822 A1    Dec. 30, 2021

(30) Foreign Application Priority Data
Nov. 24, 2017  (SE) .................... 1751447-2

(51) Int. Cl.
*G06V 40/13*        (2022.01)
*H01L 21/56*        (2006.01)
(Continued)

(52) U.S. Cl.
CPC ............ *G06V 40/13* (2022.01); *H01L 21/561* (2013.01); *H01L 21/568* (2013.01); *H01L 23/3135* (2013.01); *H04M 1/0202* (2013.01); *H04M 2201/20* (2013.01)

(58) Field of Classification Search
CPC . H01L 21/568; H01L 21/561; H01L 23/3135; H01L 21/6835; H01L 23/3107;
(Continued)

(56) References Cited

U.S. PATENT DOCUMENTS 8,717,775 B1   5/2014  Bolognia et al.
9,691,708 B1   6/2017  Huang et al.
(Continued)

FOREIGN PATENT DOCUMENTS

WO   2015174775 A1   11/2015
WO   2016190678 A1   12/2016

OTHER PUBLICATIONS

Extended European Search Report dated Feb. 9, 2021 for EP Application No. 18880560.0, 8 pages.
(Continued)

*Primary Examiner* — Premal R Patel
(74) *Attorney, Agent, or Firm* — RMCK Law Group, PLC

(57) ABSTRACT

A method of manufacturing a fingerprint sensor component having a component outline for integration into an electronic device, the method comprising the steps of: providing a fingerprint sensor package having a sensing surface, a connection surface opposite the sensing surface, and sides connecting the sensing surface and the connection surface, the connection surface having connectors for allowing electrical connection of the fingerprint sensor component to the electronic device; arranging the fingerprint sensor package on a temporary carrier with the connection surface facing the temporary carrier; and adding material at least around the sides of the fingerprint sensor package, while leaving the connection surface of the fingerprint sensor package uncovered.

13 Claims, 7 Drawing Sheets

(51) Int. Cl.
*H01L 23/31* (2006.01)
*H04M 1/02* (2006.01)

(58) Field of Classification Search
CPC ....... H01L 23/3121; H01L 2221/68327; H01L 2221/68354; H01L 2224/48091; H01L 23/3157; H01L 23/3185; G06V 40/13; G06V 40/1329; H04M 1/0202; H04M 2201/20; H04M 1/026; G06K 19/0718; G06K 19/077; H05K 3/007; H05K 3/28; H05K 2203/1305
See application file for complete search history.

(56) References Cited

U.S. PATENT DOCUMENTS

| | | |
|---|---|---|
| 2010/0039121 A1 | 2/2010 | Iliev et al. |
| 2014/0091455 A1 | 4/2014 | Strothmann et al. |
| 2014/0103943 A1 | 4/2014 | Dunlap et al. |
| 2015/0269407 A1 | 9/2015 | Chou |
| 2015/0294135 A1 | 10/2015 | Kim et al. |
| 2015/0357256 A1 | 12/2015 | Suthiwongsunthorn et al. |
| 2016/0172264 A1 | 6/2016 | Teng et al. |
| 2016/0210496 A1* | 7/2016 | Lin ................... H01L 23/3135 |
| 2016/0284642 A1 | 9/2016 | Ganesan et al. |
| 2016/0358007 A1 | 12/2016 | Chung et al. |
| 2017/0077158 A1 | 3/2017 | Huang et al. |
| 2017/0140202 A1 | 5/2017 | Huang et al. |
| 2017/0228529 A1* | 8/2017 | Huang ............... H01L 21/4857 |
| 2017/0271272 A1 | 9/2017 | Lee et al. |

OTHER PUBLICATIONS

PCT International Search Report and Written Opinion dated Feb. 13, 2019 for International Application No. PCT/SE2018/051177, 12 pages.

* cited by examiner

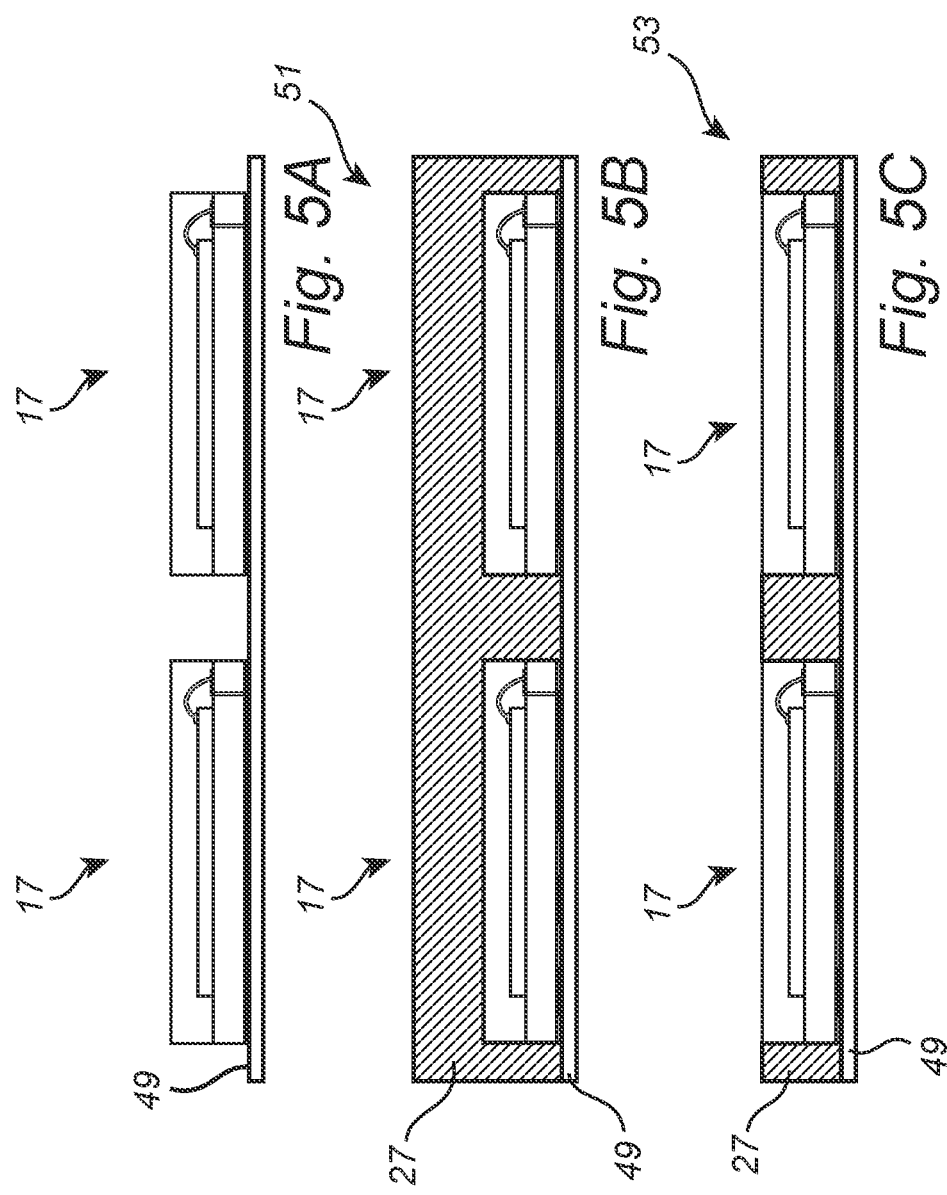

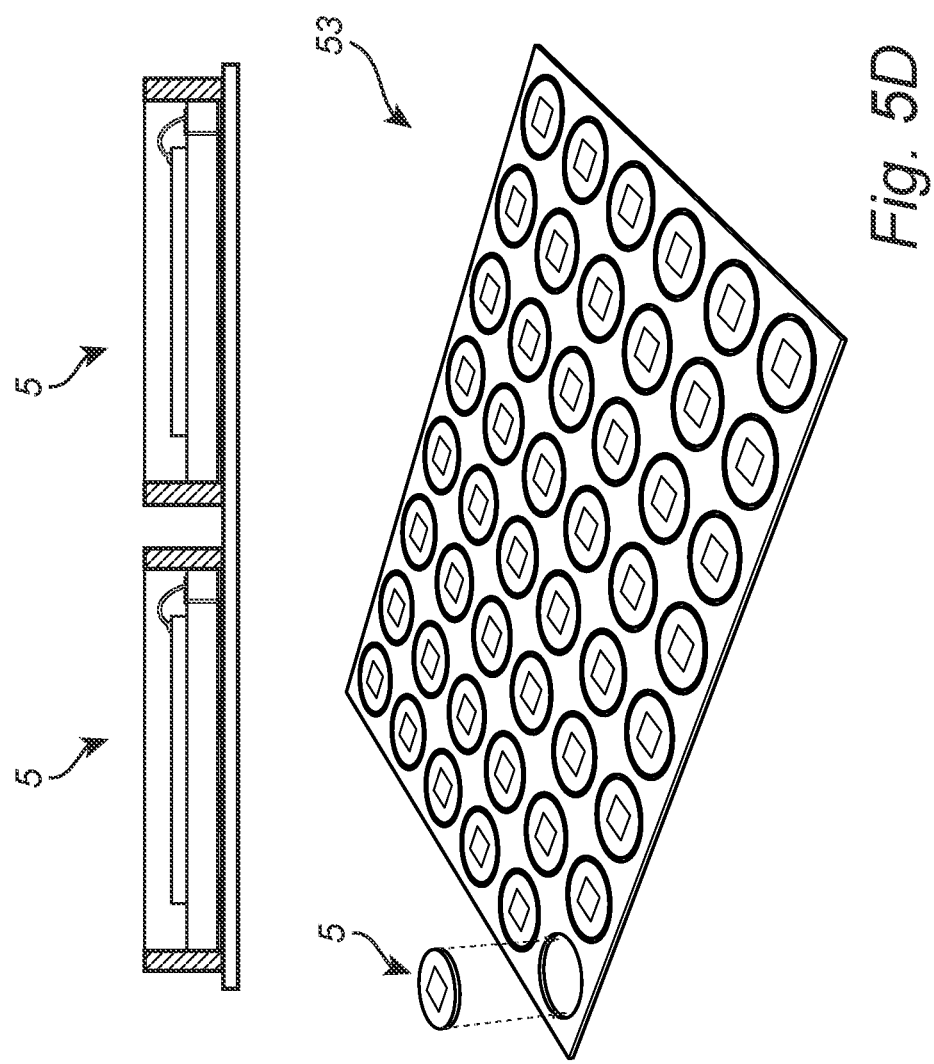

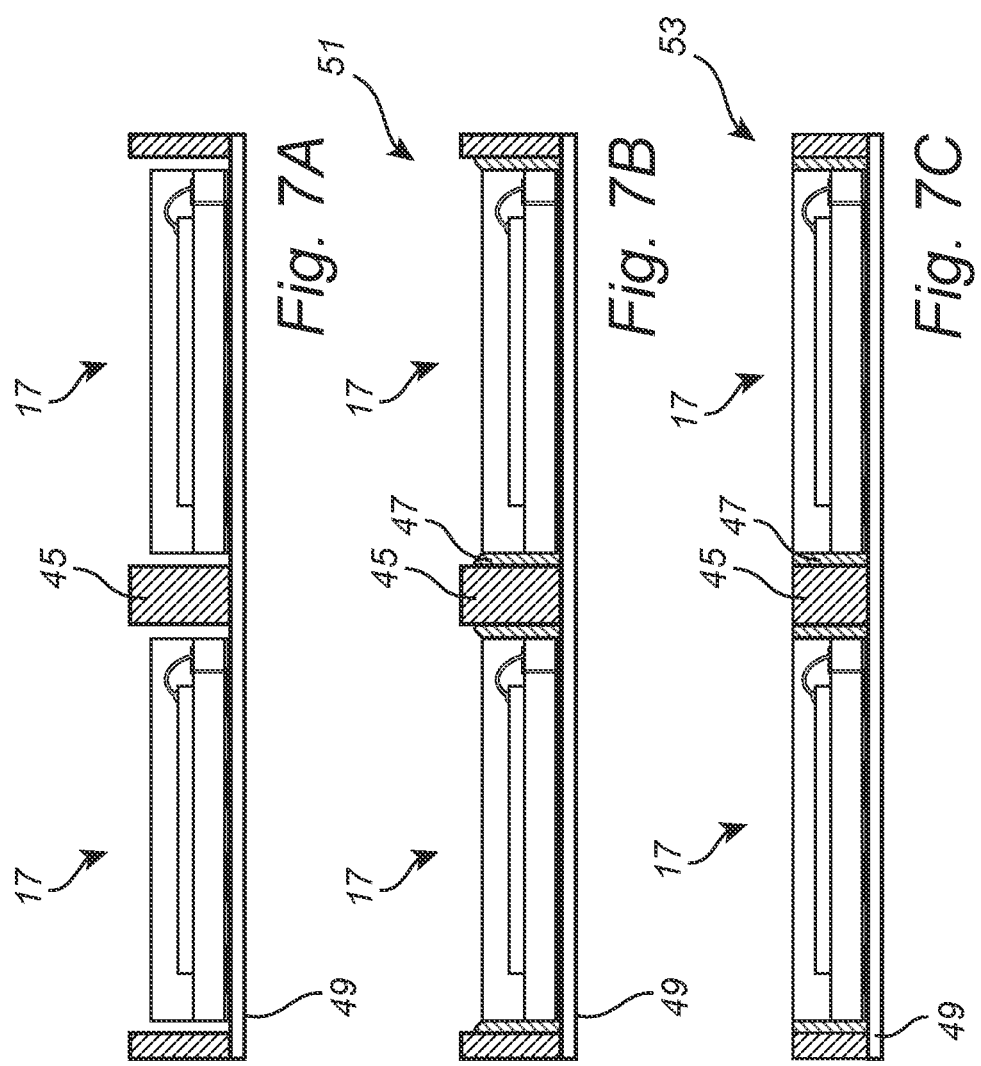
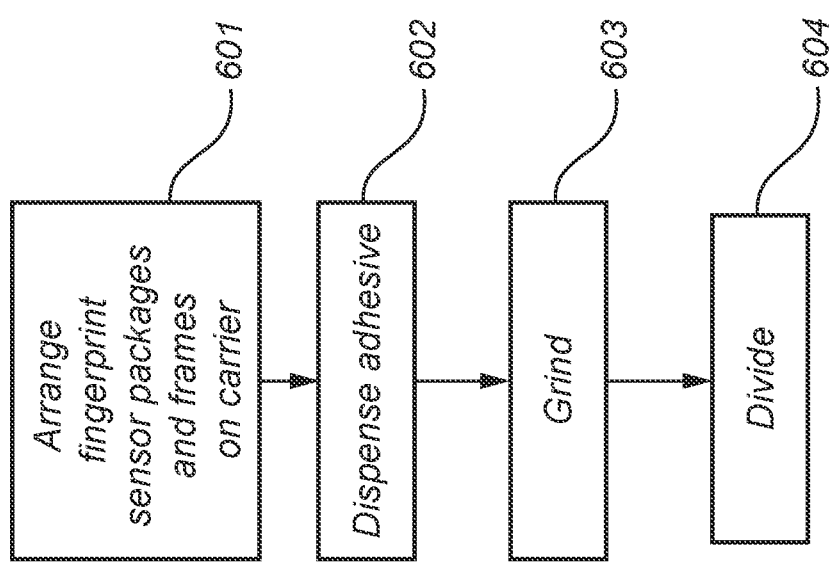

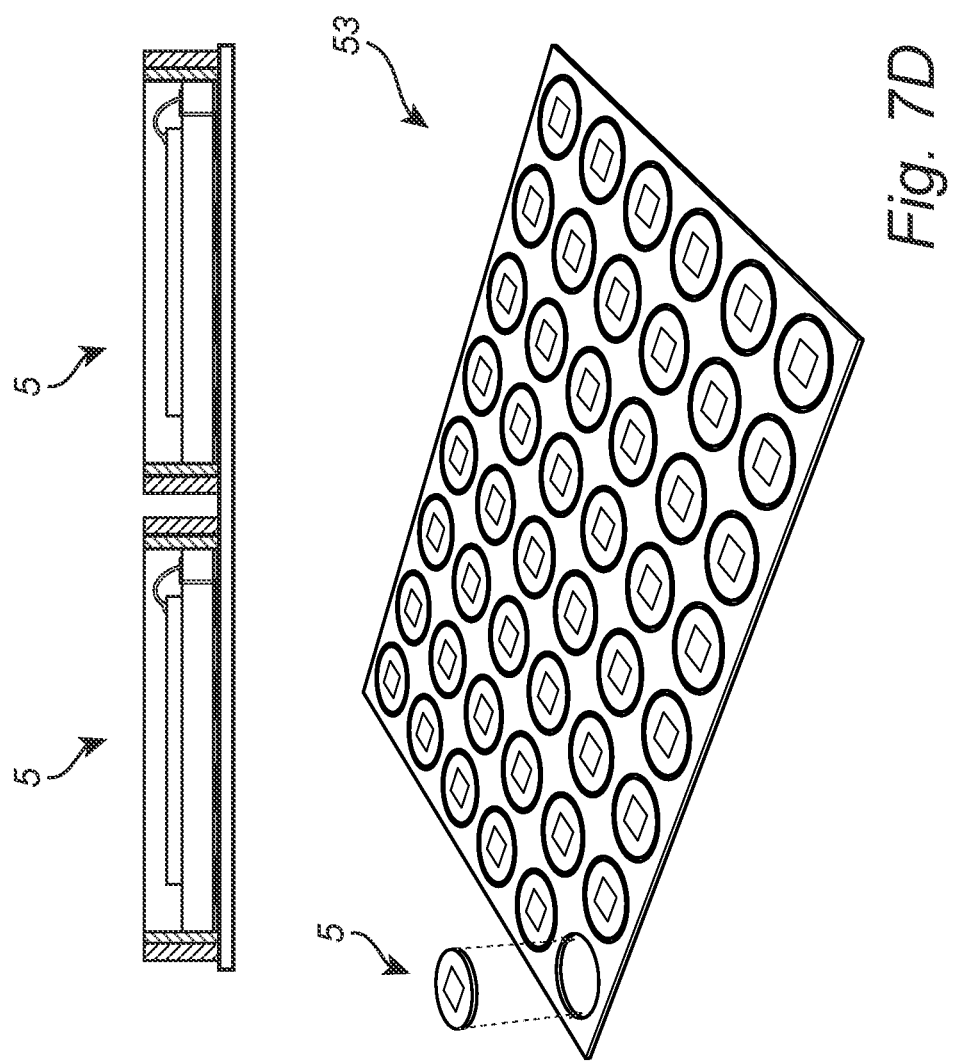

COST-EFFICIENT FINGERPRINT SENSOR COMPONENT AND MANUFACTURING METHOD

CROSS-REFERENCE TO RELATED APPLICATIONS

This application is a 371 U.S. National Stage of International Application No. PCT/SE2018/051177, filed Nov. 15, 2018, which claims priority to Swedish Patent Application No. 1751447-2, filed Nov. 24, 2017. The disclosures of each of the above applications are incorporated herein by reference in their entirety.

FIELD OF THE INVENTION

The present invention relates to a fingerprint sensor component for integration in an electronic device, and to a method of manufacturing such a fingerprint sensor component.

BACKGROUND OF THE INVENTION

Biometric systems are widely used as means for increasing the convenience and security of personal electronic devices, such as mobile phones etc. Fingerprint sensing systems, in particular, are now included in a large proportion of all newly released personal communication devices, such as mobile phones.

Fingerprint sensors are often included in a user-interaction device, such as a button or similar in the housing of the electronic device.

With the recent development of improved fingerprint sensors and biometric algorithms, smaller fingerprint sensors can be integrated in the above-mentioned user-interaction devices.

The use of smaller fingerprint sensors provides for a cost reduction of the fingerprint sensing systems. It would, however, be desirable to provide for a further reduction of the cost.

SUMMARY

In view of above-mentioned and other drawbacks of the prior art, it is an object of the present invention to provide for improved fingerprint sensor components, in particular more cost-efficient fingerprint sensor components.

According to a first aspect of the present invention, it is therefore provided a method of manufacturing a fingerprint sensor component having a component outline for integration into an electronic device, the method comprising the steps of: providing a fingerprint sensor package having a sensing surface, a connection surface opposite the sensing surface, and sides connecting the sensing surface and the connection surface, the connection surface having connectors for allowing electrical connection of the fingerprint sensor component to the electronic device; arranging the fingerprint sensor package on a temporary carrier with the connection surface facing the temporary carrier; and adding material at least around the sides of the fingerprint sensor package, while leaving the connection surface of the fingerprint sensor package uncovered.

It should be understood that the electronic device into which the fingerprint sensor component is intended to be integrated may, for example, be a personal communication device, or a token, such as a so-called smart card etc. Alternatively, the electronic device may be a fingerprint sensor module to be included in another electronic device.

The temporary carrier may be any carrier suitable for the fabrication process, and may include any carrier used in so-called wafer level fan-out processes, or in panel production processes (such as for thin film electronics). The temporary carrier may, for example, include a relatively rigid base covered by a temporary bond film (carrier tape). The relatively rigid base may be made of any material compatible with the particular fabrication process, and may thus, for instance, be made of silicon, glass, polymer or metal. Alternatively, the temporary carrier may be a carrier tape.

It should be noted that the steps of methods according to embodiments of the present invention need not necessarily be carried out in any particular order, unless explicitly or implicitly required.

The present invention is based upon the realization that it may be considerably more cost-efficient to re-package to a desired component outline an already packaged small fingerprint sensor, than to package the small fingerprint sensor to the desired component outline in a single packaging process. In particular, the present inventor has realized that the "re-packaging" according to embodiments of the present invention allows relatively costly process steps (initial packaging of integrated circuit (IC) dies) to be performed on densely arranged small fingerprint sensors, while less costly process steps (post processing of already packaged IC dies) can be performed on less densely arranged fingerprint sensor packages.

According to embodiments of the present invention, the size reduction of the fingerprint sensor ICs can thus be exploited more efficiently to achieve increased cost-reductions for the fingerprint sensor components with (lateral) component outlines suitable for the electronic devices into which the fingerprint sensor components are to be integrated. Such component outlines may typically be specified by the manufacturers of the electronic devices to harmonize with the designs of the electronic devices and/or to provide for advantageous user interaction with the electronic devices.

In embodiments, the step of adding material may comprise the step of applying a dielectric material to cover at least the sides of the fingerprint sensor package.

The dielectric material covering at least the sides of the fingerprint sensor package may, as will be known to one skilled in the art, be any dielectric embedding material suitable for the particular fabrication process. Accordingly, the dielectric material may be a non-conducting adhesive, or a molding material that may, for example be provided in granular or liquid form. Alternatively, the dielectric material may be provided in the form of a film that is laminated on the fingerprint sensor package(s) arranged on the temporary carrier. The dielectric material may be cured following application.

The dielectric material may be applied to cover the sides and the sensing surface of the fingerprint sensor package; and the method may further comprise the step of at least partly removing the dielectric material, at least over the fingerprint sensor package.

The dielectric material may be at least partly removed in such a way that a planar and smooth upper surface of the fingerprint sensor component(s) is formed by the removal process. Various material removal methods that are, per se, well known include grinding, polishing/lapping, and etching.

A sufficient thickness of the dielectric material may advantageously be removed to expose the sensing surface of the fingerprint sensor package.

In embodiments, while the dielectric material is at least partly removed, the fingerprint sensor package may be thinned down in such a way that a new sensing surface is formed. In other words, the fingerprint sensor package comprised in the fingerprint sensor component may be thinned in the same process used for at least partly removing the applied dielectric material.

These embodiments may allow for improved sensitivity of the fingerprint sensor component and/or allow for more cost-efficient manufacturing methods to be used when making the fingerprint sensor package(s), since the important thickness of the protective coating on the fingerprint sensor IC in the fingerprint sensor package/fingerprint sensor component can be defined by the material removal step in embodiments of the method according to the present invention.

According to various embodiments, the step of adding material at least around the sides of the fingerprint sensor package may comprises the step of: arranging at least one spacing member on the temporary carrier to at least partly surround the fingerprint sensor package.

It should be noted that the at least one spacing member may be arranged on the temporary carrier before or after the step of arranging the fingerprint sensor package(s) on the temporary carrier. The at least one spacing member may, for example, be made of plastic or laminate. The at least one spacing member may simultaneously perform the functions of cost-efficiently providing for the desired fingerprint sensor component outline, and aiding in the positioning of the fingerprint sensor package(s) on the temporary carrier.

The at least one spacing member may advantageously comprise a frame surrounding said fingerprint sensor package (or surrounding each fingerprint package in embodiments where a plurality of fingerprint packages are arranged mutually laterally spaced apart on the temporary carrier).

In embodiments where at least one spacing member is arranged on the temporary carrier to surround the fingerprint sensor package(s), a non-conductive adhesive may be dispensed in the space between the fingerprint sensor package(s) and the spacing member(s).

In embodiments without the provision of at least one spacing member on the temporary carrier, the fingerprint sensor package(s) may be overmolded using, per se, known molding processes, such as transfer molding or compression molding. Also in embodiments including the provision of at least one spacing member on the temporary carrier, the fingerprint sensor package(s) and the spacing member(s) may be overmolded.

The method according embodiments of the present invention may further comprise the step of removing material around the fingerprint sensor package in such a way that the component outline is achieved.

Such material removal may, for example, be achieved using mechanical sawing or scribing, laser cutting, water jet cutting, and etching etc.

Advantageously a large number of fingerprint sensor packages may be arranged on the temporary carrier, material may be added around each fingerprint sensor package using any of the different processes described above or a combination thereof to form a panel or so-called strip, and the panel or strip may be cut (preferably using one of the above-describe methods of removing dielectric material) to separate the panel or strip into fingerprint sensor components having the desired component outline.

As an alternative to removing material to achieve the desired component outline, the material may be added around the fingerprint sensor package(s) in such a way that the component outline is achieved. This may, for example be achieved using a mold with one or several mold cavities shaped in accordance with the desired component outline.

According to various embodiments, furthermore, the fingerprint sensor package may comprise: a package substrate having a die support side and an external connection side opposite the die support side; a fingerprint sensor die electrically and mechanically connected to the die support side of the package substrate; and a protective coating covering the fingerprint sensor die and the package substrate, the connectors of the fingerprint sensor package being arranged on the external connection side of the package substrate.

According to a second aspect of the present invention, there is provided a fingerprint sensor component having a component outline for integration into an electronic device, the fingerprint sensor component comprising: a fingerprint sensor package having a sensing surface, a connection surface opposite the sensing surface, and sides connecting the sensing surface and the connection surface, the connection surface having connectors for allowing electrical connection of the fingerprint sensor component to the electronic device, the fingerprint sensor package having a fingerprint sensor package outline, different from the component outline; and material added at least around the sides of the fingerprint sensor package, while leaving the connection surface of the fingerprint sensor package uncovered, the material defining the component outline of the fingerprint sensor component.

Moreover, the fingerprint sensor component according to various embodiments of the present invention may advantageously be included in an electronic device, further comprising processing circuitry electrically coupled to the fingerprint sensor component through the connectors on the connection surface of the fingerprint sensor package comprised in the fingerprint sensor component.

Further embodiments of, and effects obtained through this second aspect of the present invention are largely analogous to those described above for the first aspect of the invention.

BRIEF DESCRIPTION OF THE DRAWINGS

These and other aspects of the present invention will now be described in more detail, with reference to the appended drawings showing an example embodiment of the invention, wherein:

FIG. 4 is a flow-chart illustrating a first example embodiment of the manufacturing method according to the present invention;

FIGS. 5A-D schematically illustrate the respective method steps in the flow-chart in FIG. 4;

FIG. 6 is a flow-chart illustrating a second example embodiment of the manufacturing method according to the present invention; and FIGS. 7A-D schematically illustrate the respective method steps in the flow-chart in FIG. 6.

DETAILED DESCRIPTION OF EXAMPLE EMBODIMENTS

In the present detailed description, various embodiments of the fingerprint sensor component according to the present invention are mainly described with reference to a fingerprint sensor component including a semiconductor-based capacitive fingerprint sensor integrated circuit (IC). It should be noted that fingerprint sensor components comprising other types or configurations of fingerprint sensors also fall within the scope defined by the claims. For instance, the fingerprint sensor comprised in the fingerprint sensor component may sense the fingerprint of a finger placed on the sensor using one or several other measurement principles, such as ultrasonic, thermal, or optical measurement.

Figure 1:
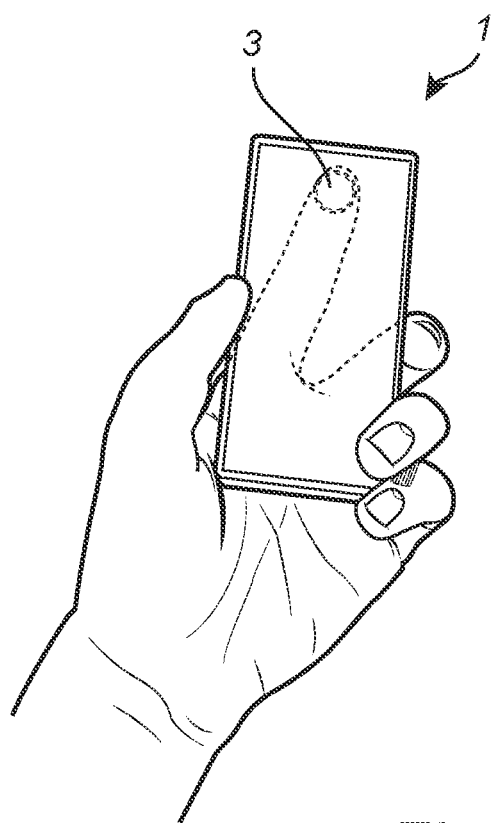
FIG. 1 is an illustration of an exemplary electronic device comprising a fingerprint sensor component according to an embodiment of the present invention, in the form of a mobile phone.

FIG. 1 schematically shows an electronic device, here in the form of a mobile phone 1, comprising a fingerprint sensor module 3, including fingerprint sensor component according to embodiments of the present invention. The fingerprint sensor component may be included in the fingerprint sensor module 3 that is integrated into the mobile phone 1, or may be directly integrated into the mobile phone 1. In either case, the sensing side of the fingerprint sensor component may be on the back face of the mobile phone 1 as in the example of FIG. 1, or on the front face, or on a side face of the mobile phone 1.

Figure 2:
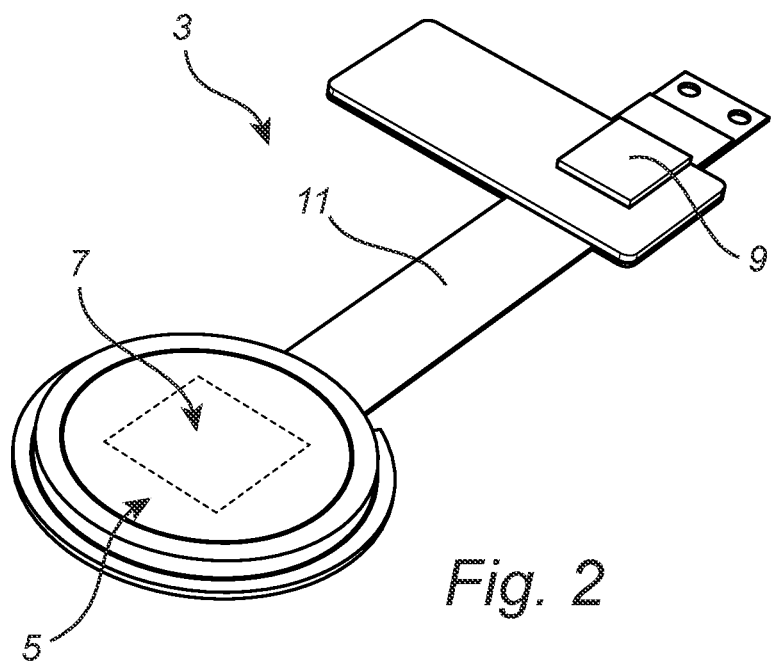
FIG. 2 is a schematic illustration of the fingerprint sensor module comprised in the mobile phone in FIG. 1.

FIG. 2 schematically illustrates an example fingerprint sensor module 3 that may be comprised in the mobile phone 1 in FIG. 1. Referring to FIG. 2, the fingerprint sensor module 3 comprises the above-mentioned fingerprint sensor component 5, which includes a fingerprint sensor IC 7 (schematically indicated by the dashed line box in FIG. 2), a power supply modulation IC 9, and a flex film connector 11 for allowing electrical connection between the fingerprint sensor component 5 and the electronic device (mobile phone 1) in which the fingerprint sensor component 5 is included.

The power supply modulation IC 9 may modulate the reference potential(s) of the fingerprint sensor IC 7 in relation to the reference potential(s) of the electronic device 1 as is described in, for example, U.S. Pat. No. 9,383,876.

Figure 3A:
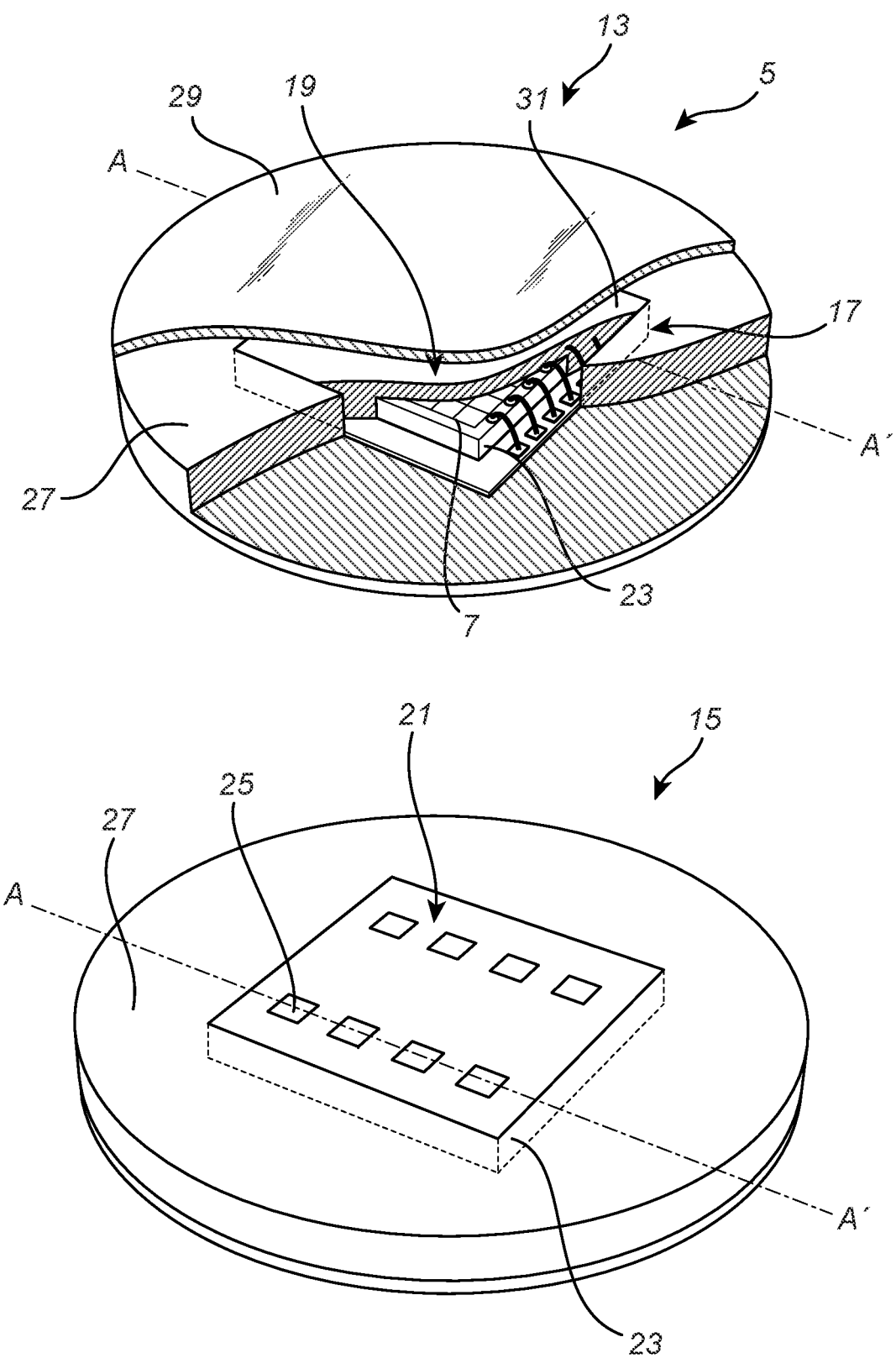
FIG. 3A schematically shows the fingerprint sensor component comprised in the fingerprint sensor module in FIG. 2 from the fingerprint sensing side of the fingerprint sensor component (top), and from the connector side of the fingerprint sensor component (bottom)

FIG. 3A schematically shows the fingerprint sensor component 5 in FIG. 2 from the fingerprint sensing side 13 of the fingerprint sensor component 5 (top), and from the connector side 15 of the fingerprint sensor component (bottom).

Referring to FIG. 3A, the fingerprint sensor component 5 comprises a fingerprint sensor package 17 having a sensing surface 19, a connection surface 21 opposite the sensing surface 19, and sides 23 connecting the sensing surface 19 and the connection surface 21. The connection surface 21 has connectors 25 for allowing electrical connection of the fingerprint sensor component 5 to the rest of the electronic device (mobile phone 1). In addition to the fingerprint sensor package 17, the fingerprint sensor component 5 comprises material 27 added at least around the sides 23 of the fingerprint sensor package 17, and an optional dielectric top coating 29 covering both the above-mentioned material 27 and the sensing surface 19 of the fingerprint sensor package 17. As can be understood by studying FIG. 3A, the component outline suitable for the electronic device 1 (here a round shape) has been achieved using the material 27 added at least around the sides of the fingerprint sensor package 17.

As will be described in greater detail below with reference to FIG. 3B and FIG. 3C, the fingerprint sensor package 17 includes the above-mentioned fingerprint sensor IC 7, which is covered by a protective coating 31, as is schematically indicated in FIG. 3A.

Figure 3B:
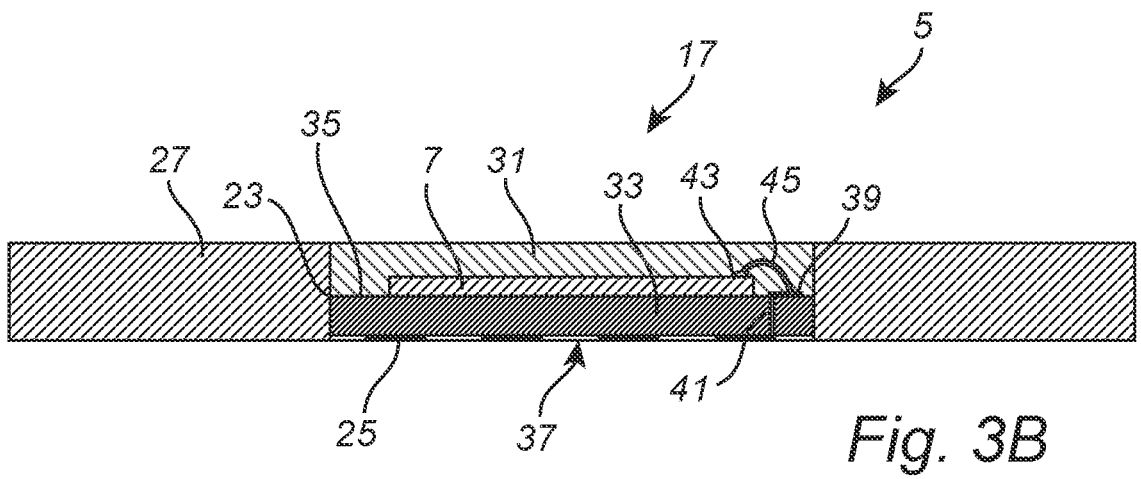
FIG. 3B is a schematic cross-section view of a first embodiment of the fingerprint sensor component in FIG. 3A.

FIG. 3B is a schematic view of the cross-section along the line A-A' in FIG. 3A of a first embodiment of the fingerprint sensor component 5 in FIG. 3A, in which the material 27 added at least around the sides 23 of the fingerprint sensor package 17 is provided in the form of a cured molding compound. For simplicity, the cross-section in FIG. 3B is shown without the optional dielectric top coating 29 in FIG. 3A.

As is schematically shown in FIG. 3B, the fingerprint sensor package 17 included in the fingerprint sensor component 5 comprises a package substrate 33 having a die support side 35 and an external connection side 37 opposite the die support side 35. The package substrate includes die connection pads 39 on the die support side 35, and vias 41 for electrical connection between the die connection pads 39 and the connectors 25 on the external connection side 37 of the package substrate 33.

Referring to FIG. 3B, the fingerprint sensor die 7 is attached to the die support side 35 of the package substrate 33, and connection pads 43 on the fingerprint sensor die 7 are electrically connected to the die connection pads 39, here through bond wires 46.

Figure 3C:
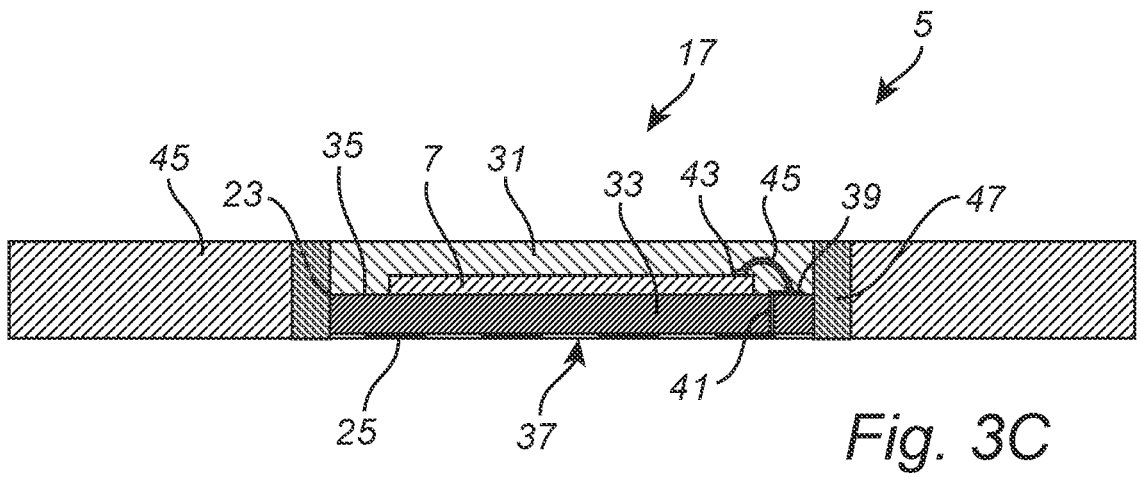
FIG. 3C is a schematic cross-section view of a second embodiment of the fingerprint sensor component in FIG. 3A.

FIG. 3C is a schematic view of the cross-section along the line A-A' in FIG. 3A of a second embodiment of the fingerprint sensor component 5 in FIG. 3A, in which the material 27 added at least around the sides 23 of the fingerprint sensor package 17 is provided in the form of a plastic frame 45 surrounding the fingerprint sensor package 17, and adhesive 47 in the gap between the fingerprint sensor package 17 and the plastic frame 45.

Although it is indicated in FIGS. 3A-C that the fingerprint sensor IC 7 is electrically connected to the package substrate 33 using bond wires 46, it should be understood that this electrical connection may be made using any other suitable connection technique, such as using conductive vias through the fingerprint sensor IC 7 and pads or bumps on the backside of the fingerprint sensor IC 7 etc. Furthermore, the package substrate 33 need not be a substrate of circuit board type as is schematically indicated here, but may, for example, be a metal substrate, such as a so-called leadframe or similar.

A method according to a first embodiment of the present invention of manufacturing the fingerprint sensor component 5 in FIG. 3B will now be described with reference to the flow-chart in FIG. 4, and the accompanying illustrations in FIGS. 5A-D.

In a first step 401, a plurality of fingerprint sensor packages 17 are arranged on a carrier tape 49 with an adhesive layer for keeping the fingerprint sensor packages 17 in place during the subsequent processing. This is schematically illustrated in FIG. 5A.

Thereafter, in step 402, the fingerprint sensor packages 17 arranged on the carrier tape 49 are covered by a dielectric material 27.

The dielectric material 27 may, as will be known to one skilled in the art, be any dielectric embedding material suitable for the particular fabrication process. Accordingly, the dielectric material may be a molding material that may, for example be provided in granular or liquid form. Alternatively, the dielectric material may be provided in the form of a film that is laminated on the fingerprint sensor packages 17 arranged on the carrier tape 49.

In the subsequent step 403, some of the dielectric material 27 added in step 402 is removed by thinning the fingerprint sensor package panel 51 from the top side thereof, as is schematically indicated in FIG. 5C. Advantageously, the fingerprint sensor package panel 51 may be thinned sufficiently far to at least expose the sensing surface of each fingerprint sensor package 17. In embodiments, it may be advantageous to continue the thinning process so that the fingerprint sensor package 17 is thinned down in such a way that a new sensing surface is formed. Various thinning methods that are, per se, well known include grinding, polishing/lapping, and etching.

After this step, a panel or so-called strip 53 has been formed, which may include hundreds of re-packaged fingerprint sensor packages 17. In embodiments, the manufacturing method may end here, and the strip 53 may be delivered for further processing at another facility.

Optionally, the strip may be divided, in step 404, by cutting through the dielectric material 27 between adjacent fingerprint sensor packages 17 to form a plurality of separated fingerprint sensor components 5. This is schematically shown in FIG. 5D. It should be understood that the strip may be divided while arranged on the carrier tape 49, or following debonding from the carrier tape 49.

A method according to a second embodiment of the present invention of manufacturing the fingerprint sensor component 5 in FIG. 3C will now be described with reference to the flow-chart in FIG. 6, and the accompanying illustrations in FIGS. 7A-D.

In a first step 601, a plurality of fingerprint sensor packages 17 are arranged, together with at least one frame 45 surrounding the fingerprint sensor packages 17, on a carrier tape 49 with an adhesive layer for keeping the fingerprint sensor packages 17 in place during the subsequent processing. This is schematically illustrated in FIG. 7A. It should be understood that a plurality of frames may be provided, such as one frame for each fingerprint sensor package 17. Advantageously, however, one frame 45 may have openings for a plurality of fingerprint sensor packages 17. Either of the frame(s) 45 and the fingerprint sensor packages 17 may first be arranged on the carrier 49. It may be advantageous to first arrange a frame 45 with openings for a plurality of fingerprint sensor packages 17, and then place the fingerprint sensor packages 17 in the openings.

Thereafter, in step 602, a suitable dielectric material, such as an adhesive 47 is dispensed to fill the gaps between the frame 45 and the fingerprint sensor packages 17.

In the subsequent step 403, some of the frame 45 and adhesive 47 is removed by thinning the fingerprint sensor package panel 51 from the top side thereof, as is schematically indicated in FIG. 7C. Advantageously, the fingerprint sensor package panel 51 may be thinned sufficiently far to at least expose the sensing surface of each fingerprint sensor package 17. In embodiments, it may be advantageous to continue the thinning process so that the fingerprint sensor package 17 is thinned down in such a way that a new sensing surface is formed. Various thinning methods that are, per se, well known include grinding, polishing/lapping, and etching.

After this step, a panel or so-called strip 53 has been formed, which may include hundreds of re-packaged fingerprint sensor packages 17. In embodiments, the manufacturing method may end here, and the strip 53 may be delivered for further processing at another facility.

Optionally, the strip may be divided, in step 604, by cutting through the frame 45 between adjacent fingerprint sensor packages 17 to form a plurality of separated fingerprint sensor components 5. This is schematically shown in FIG. 7D. It should be understood that the strip may be divided while arranged on the carrier tape 49, or following debonding from the carrier tape 49.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method of manufacturing a fingerprint sensor component having a component outline for integration into an electronic device, the method comprising the steps of:
providing a fingerprint sensor package including:
a fingerprint sensor integrated circuit (IC) covered by a protective coating having a sensing surface, and
a package substrate having a die support side, supporting the fingerprint sensor IC, and an external connection side opposite the die support side, the external connection side of the package substrate providing a connection surface of the fingerprint sensor package having connectors for allowing electrical connection of the fingerprint sensor component to said electronic device;
arranging said fingerprint sensor package on a temporary carrier with said connection surface facing said temporary carrier; and
adding, while the fingerprint sensor package is arranged on the temporary carrier, material at least around sides of said fingerprint sensor package connecting the sensing surface and the connection surface of the fingerprint sensor package, while leaving the connection surface of said fingerprint sensor package uncovered.

2. The method according to claim 1, wherein the step of adding material comprises the step of:
applying a dielectric material to cover at least the sides of said fingerprint sensor package.

3. The method according to claim 2, wherein:
the dielectric material is applied to cover the sides and the sensing surface of said fingerprint sensor package; and
the method further comprises the step of at least partly removing said dielectric material, at least over said fingerprint sensor package.

4. The method according to claim 3, wherein a sufficient thickness of said dielectric material is removed to expose the sensing surface of said fingerprint sensor package.

5. The method according to claim 4, wherein, while said dielectric material is at least partly removed, said fingerprint sensor package is thinned down in such a way that a new sensing surface is formed.

6. The method according to claim 1, wherein the step of adding material comprises the step of:
arranging at least one spacing member on said temporary carrier to at least partly surround said fingerprint sensor package.

7. The method according to claim 6, wherein said at least one spacing member comprises a frame surrounding said fingerprint sensor package.

8. The method according to claim 1, further comprising the step of:
removing material around said fingerprint sensor package in such a way that said component outline is achieved.

9. The method according to claim 1, comprising the steps of:
providing a plurality of fingerprint sensor packages, each having a sensing surface, a connection surface opposite the sensing surface, and sides connecting the sensing surface and the connection surface, the connection surface having connectors for allowing electrical connection of the fingerprint sensor component to said electronic device;
arranging each fingerprint sensor package in said plurality of fingerprint sensor packages on a temporary carrier with said connection surface facing said temporary carrier; and
adding material at least around the sides of each fingerprint sensor package in said plurality of fingerprint sensor packages to achieve said component outline, while leaving the connection surface of said fingerprint sensor package uncovered.

10. A fingerprint sensor component having a component outline for integration into an electronic device, said fingerprint sensor component comprising:
a fingerprint sensor package including:
a fingerprint sensor integrated circuit (IC) covered by a protective coating having a sensing surface, and
a package substrate having a die support side, supporting the fingerprint sensor IC, and an external connection side opposite the die support side, the external connection side of the package substrate providing a connection surface of the fingerprint sensor package having connectors for allowing electrical connection of the fingerprint sensor component to said electronic device, said fingerprint sensor package having a fingerprint sensor package outline, different from said component outline; and
material added at least around the sides of said fingerprint sensor package, while leaving the connection surface of said fingerprint sensor package uncovered, said material defining the component outline of said fingerprint sensor component.

11. The fingerprint sensor component according to claim 10, wherein said material comprises a molding compound or an adhesive.

12. The fingerprint sensor component according to claim 10, wherein said material comprises at least one spacing member arranged to at least partly surround said fingerprint sensor package.

13. An electronic device comprising:
processing circuitry; and
the fingerprint sensor component according to claim 10, electrically coupled to said processing circuitry through the connectors on the connection surface of the fingerprint sensor package comprised in said fingerprint sensor component.

\* \* \* \* \*